US00RE35141E

United States Patent [19]

Ozaki et al.

[11] E Patent Number: Re. 35,141

[45] Reissued Date of Patent: Jan. 9, 1996

[54] SUBSTRATE BIAS GENERATING CIRCUIT

[75] Inventors: Hideyuki Ozaki; Kazuyasu Fujishima; Kazuhiro Shimotori, all of Itami, Japan

[73] Assignee: Mitsubishi Denki Kabushiki Kaisha, Tokyo, Japan

[21] Appl. No.: 142,931

[22] Filed: Oct. 29, 1993

Related U.S. Patent Documents

Reissue of:

[64] Patent No.: 4,455,628
Issued: Jun. 19, 1984
Appl. No.: 439,215
Filed: Nov. 4, 1982

[30] Foreign Application Priority Data

Dec. 17, 1981 [JP] Japan ..... 56-204658

[51] Int. Cl.[6] ..... G11C 7/00

[52] U.S. Cl. ..... 365/226; 365/193; 365/233; 327/536; 327/537

[58] Field of Search ..... 365/226, 233, 365/193, 227; 307/296.1, 296.2

[56] References Cited

FOREIGN PATENT DOCUMENTS 0031672 7/1981 European Pat. Off. .
56-44570 10/1981 Japan .

*Primary Examiner*—Do Hyun Yoo
*Attorney, Agent, or Firm*—Oblon, Spivak, McClelland, Maier & Neustadt

[57] ABSTRACT

The disclosure described a substrate bias generating circuit in which an internal $\overline{RAS}$ (Row Address Strobe) signal and an internal CAS (Column Address Strobe) signal, both of which are synchronized with an external $\overline{RAS}$ signal and external $\overline{CAS}$ supplied from outside in addition to self-oscillator, activate circuits [comprising] *including* capacitors and rectifying elements respectively so as to reduce wattage dissipation thereof during holding time of RAM and be obtained increased charge pump current during operation thereof.

4 Claims, 3 Drawing Sheets

SUBSTRATE BIAS GENERATING CIRCUIT

Matter enclosed in heavy brackets [ ] appears in the original patent but forms no part of this reissue specification; matter printed in italics indicates the additions made by reissue.

The present invention relates to a substrate bias generating circuit for an address multiplex type dynamic MOS random access memory.

Figure 1:
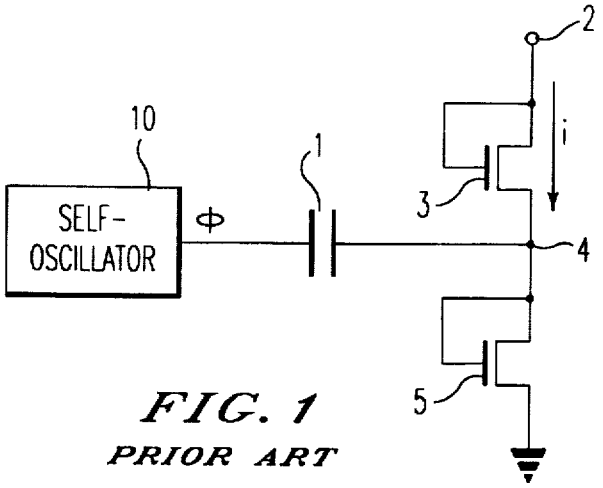
FIG. 1 PRIOR ART

FIG. 1 shows a conventional substrate bias generating circuit for an address multiplex type dynamic MOS random access memory.

In the above device, reference numeral 1 identifies a capacitor one of which electrode is connected with an output of a self-oscillator 10. Reference numeral 2 identifies an output terminal of substrate bias generating circuit and reference numerals 3 identifies a MOS transistor. Both drain electrode and gate electrode of MOS transistor 3 are connected with output terminal 2 whereas the source electrode of MOS transistor 3 is connected with the other electrode 4 of capacitor 1. Both drain electrode and gate electrode of a MOS transistor 5 are connected with node 4.

Whereas a source electrode thereof is grounded. A ring oscillator which comprises an odd number of inverters connected in series with each other can be adopted as an embodiment of self-oscillator shown in FIG. 2. In the embodiment illustrated in FIG. 2, an amplitude of output is able to be obtained by the expression $Vcc-V_T(V)$ in which Vcc indicates an electrode voltage and $V_T$ indicates a threshold voltage of MOS transistor comprising a substrate bias generating circuit. However, an output buffer circuit or a device comprising ED will be applied to obtain an amplitude of output of which potential is Vcc(V).

An operation of substrate bias generating circuit is illustrated hereinafter by using FIG. 1 and FIG. 3 which shows variations of nodes included in the circuit shown in FIG. 1.

Self-oscillator 10 oscillates under the amplitude from O(V) to Vcc(V). At this point, potential at node 4 changes because of capacitive coupling of capacitor 1. In this condition, when the potential of node 4 becomes more than threshold voltage $V_T(V)$ of transistor 5,H level of node 4 is clamped at potential $V_T(V)$ so as to conduct transistor 5. Thus, the potential at node 4 changes into negative by value −Vcc(V) so that the lowest potential at node 4 becomes a value corresponding to the expression $V_T-Vcc(V)$. Consequently, output terminal 2 of substrate bias generating circuit reaches a potential which is higher than that of node 4 by threshold voltage $V_T$ and finally, the potential at output terminal 2 becomes to indicate a value corresponding to the expression $2V_T-Vcc(V)$.

When potential at output terminal 2 of substrate bias generating circuit is zero(0) V, a charge pump current flowing in transistor 3 is obtained by the following equation:

$$i=f\cdot C\cdot V \qquad (1)$$

f: oscillation frequency of self-oscillator 10

C: capacity of capacitor 1

V: output amplitude of self-oscillator 10

Thus, it is apparent from the above equation that charge pump current i would be increased by making the oscillation frequency of self-oscillator 10 higher, making output amplitude thereof larger or making capacity of capacitor 1 larger. However, it is necessary to select one of the three ways illustrated above in order to improve the activation ability relative to a load of capacitor or to increase a rate of switching in each state of inverters included in self-oscillator 10 shown in FIG. 2. And that, wattage dissipation should be increased in self-oscillator 10.

Recently, as microminiaturized MOS transistors, it appears a big problem in MOS transistors that substrate current is increased by diffusion of holes over substrate, which are generated in the high electric field around drain in MOS transistor, so as to reduce substrate bias potential. However, conventional substrate bias generating circuit as illustrated above has dissadvantages such that wattage dissipation in self-oscillator should be increased in order to increase charge pump current whereas wattage dissipation should be maintained at low level during holding time thereof, particularly in dynamic random access memory and so forth so that it is impossible to resolve the above contradication by making use of conventional ways.

It is an object of the present invention to provide a substrate bias generating circuit in which an internal $\overline{RAS}$ (Row Address Strobe) signal and an internal $\overline{CAS}$ (Column Address Strobe) signal, both of which are synchronized with an external $\overline{RAS}$ signal and an external $\overline{CAS}$ supplied from outside in addition of self-oscillator, activate circuits comprising capacitors and rectifying elements respectively so as to reduce wattage dissipation thereof during holding time of RAM and be obtained increased charge pump current during operation thereof.

The foregoing and other objects, features and advantages of the invention will be apparent from the following more particular description of preferred embodiment of the invention as illustrated in the accompanying drawings.

Figure 2:
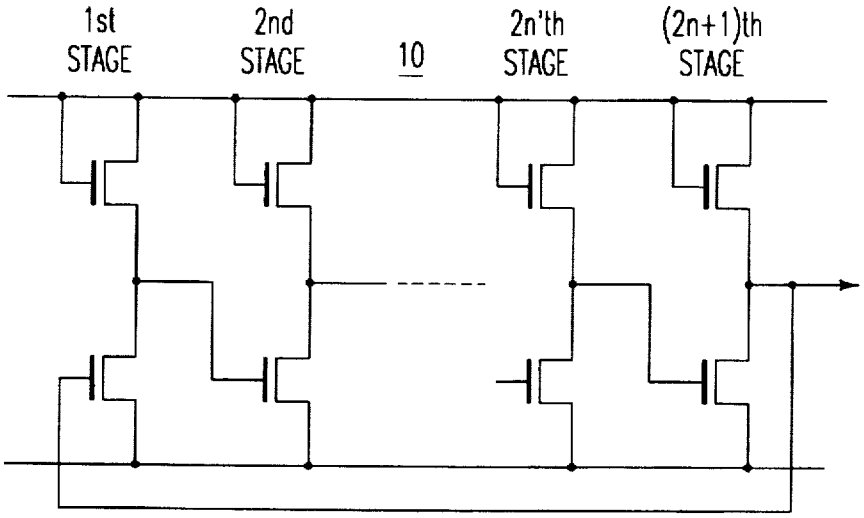
FIG. 2 PRIOR ART
Figure 3:
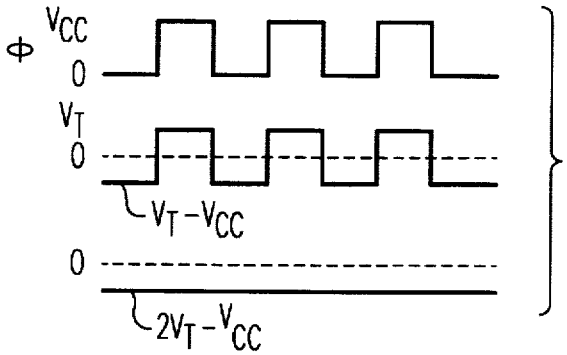
FIG. 3 PRIOR ART
Figure 4:
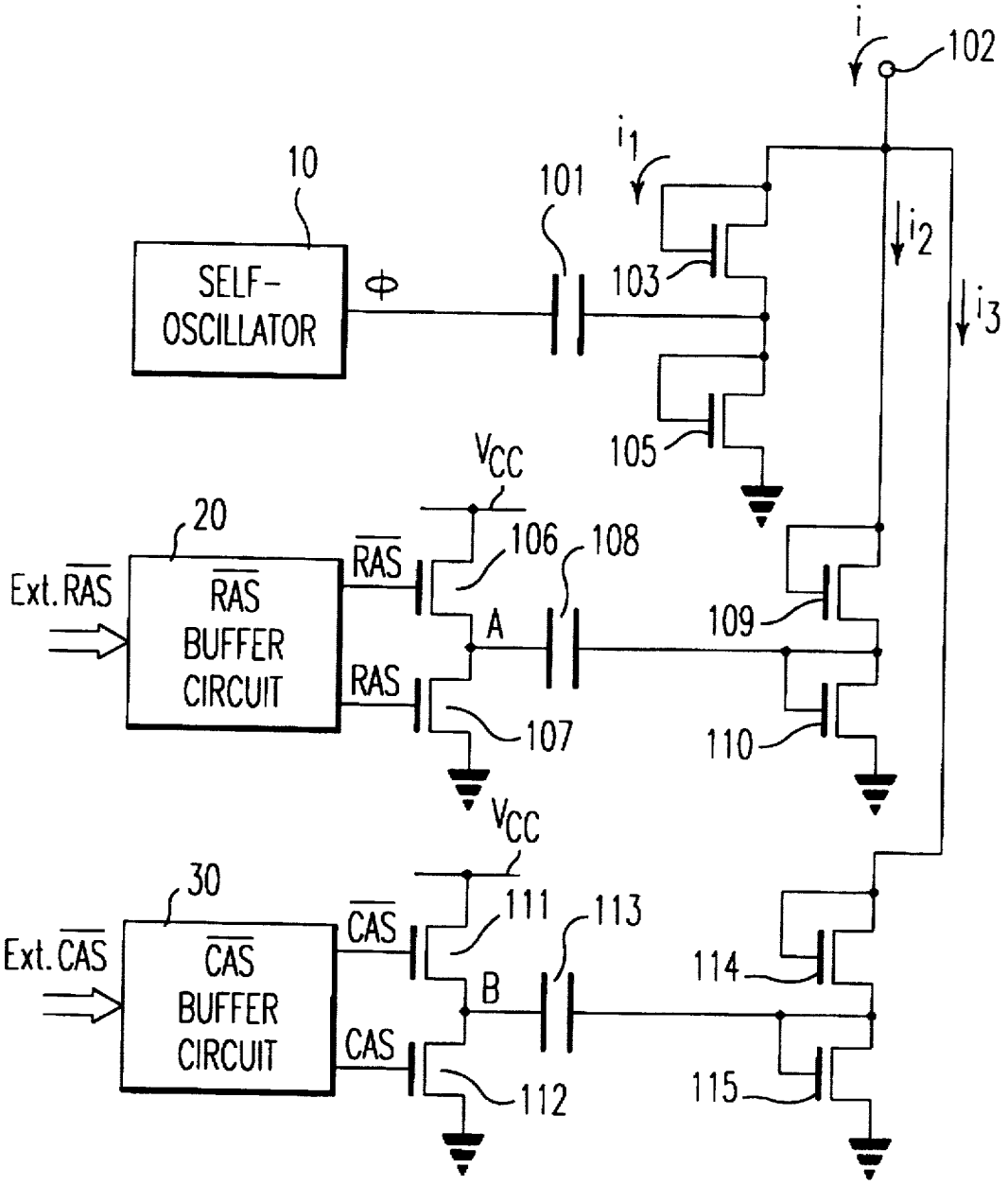
Figure 5:
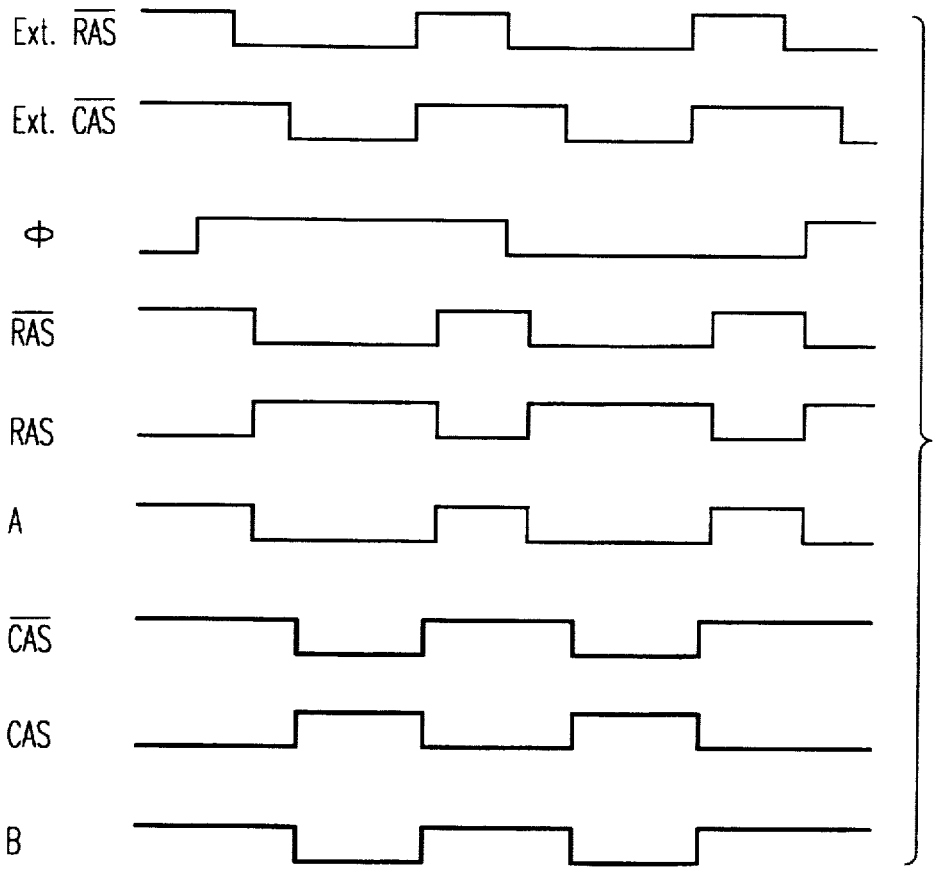
Figure 6:
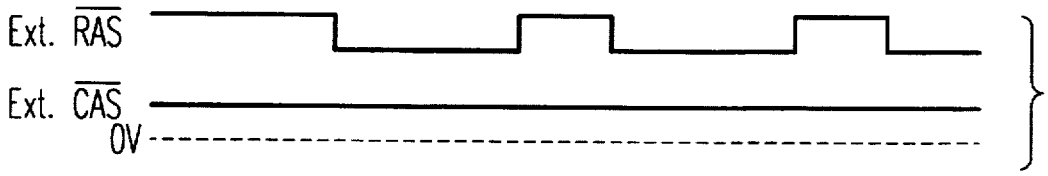
Figure 7:
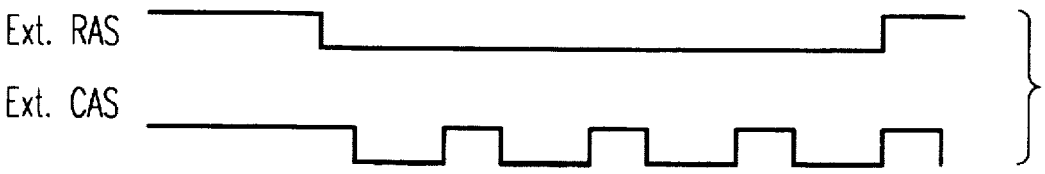

FIG. 1 is a conventional substrate bias generating circuit diagram,

FIG. 2 is a circuit diagram of self-oscillator used in the circuit shown in FIG. 1, FIG. 3 is a view showing waveforms of potentials at various nodes in the substrate bias generating circuit shown in FIG. 1, FIG. 4 is a substrate bias generating circuit diagram according to the present invention, FIG. 5 is a view showing waveforms of potentials at various nodes in the substrate bias generating circuit shown in FIG. 4, FIGS. 6 and 7 are views showing the timing relationship between Ext, $\overline{RAS}$ and Ext, $\overline{CAS}$ used to illustrate various operation modes of dynamic type RAM.

In FIG. 4 self-oscillator 10 is a conventional type thereof and $\overline{RAS}$ buffer circuit 20 generates various clocks which are applied in RAM to synchronize with external $\overline{RAS}$ signal (Ext, $\overline{RAS}$) while $\overline{CAS}$ buffer circuit 30 generates various clocks which are used in RAM to synchronize with external $\overline{CAS}$ signal (Ext, $\overline{CAS}$). Reference numerals 101, 108 and 113 identify capacitors and reference numerals 102 indicates output terminal of substrate bias generating circuit according to the present invention. Reference numerals 103 and 105 indicate MOS transistors comprising a rectifier circuit. $\overline{RAS}$ signal being in phase with Ext, $\overline{RAS}$ and RAS signal being in opposite phase with Ext, $\overline{RAS}$, both of which are generated in $\overline{RAS}$ buffer circuit 20, are respectively introduced into gates of a buffer circuit comprising MOS transistor 106 and 107. Output of the buffer circuit is in connection with the one electrode of capacitor 108 whereas the other electrode thereof is in connection with a rectifier circuit comprising MOS transistors 109 and 110. $\overline{CAS}$ signal being in phase with Ext, $\overline{CAS}$ and CAS signal being in opposite phase with Ext, $\overline{CAS}$, both of which are generated in $\overline{CAS}$ buffer circuit 30 are respectively entered into a buffer circuit comprising MOS transistors 111 and 112. Output of the buffer circuit is in connection with the one electrode of capacitor 113 whereas the other electrode thereof is in connection with a rectifier circuit comprising MOS transistors 114 and 115.

An operation of substrate bias generation device according to the present invention is illustrated with referring to FIG. 5. Suppose inputs of Ext, $\overline{RAS}$ and Ext, $\overline{CAS}$ are applied as shown in FIG. 5. Output $\phi$ of self-oscillator 10 is periodically generated without regarding to these external signals. Internal signals $\overline{RAS}$ and RAS in $\overline{RAS}$ buffer circuit 20 are generated slightly behind Ext,, $\overline{RAS}$ signal. Thus, output from the buffer circuit comprising MOS transistors 106 and 107 forms a waveform like A shown in FIG. 5. Likewise, output through circuit 30 from the buffer circuits comprising MOS transistors 111 and 112 makes a waveform like B shown in FIG. 5. Consequently electric current i passed through output terminal 102 of substrate bias generating circuit is the sum of charge pump current $i_1$ generated by capacitor 101 and rectifier circuit both of which are activated by self-oscillator 10, charge pump current $i_2$ generated by capacitor 106 and rectifier circuit both of which are driven by signals through RAS line and charge pump current $i_3$ generated by capacitor 113 and rectifier circuit both of which are activated by signal through CAS line so as to be able to obtain a large charge pump current.

In dynamic type random access memory, there are various types of operation modes depending on signals given by Ext, $\overline{RAS}$ and Ext, $\overline{CAS}$. In general, relationship for timing between Ext, $\overline{RAS}$ and Ext, $\overline{CAS}$ shown in FIG. 6 is called RAS only refresh mode in which memory cell is refreshed by way of changing "H"→"L"→"H"→"L" as to Ext, $\overline{RAS}$ with sustaining Ext, $\overline{CAS}$ at "H". In this case, according to the present invention, all charge pump current is the sum of charge pump current $i_1$ from self-oscillator and charge pump current $i_2$ based on signal from RAS line. Relationship for timing between Ext, $\overline{RAS}$ and Ext, $\overline{CAS}$ shown in FIG. 7 is called a nibble mode or a page mode of type which can read the data out at high rate by changing "H"→"L"→"H"→"L" as to Ext, $\overline{CAS}$ with maintaining Ext, $\overline{RAS}$ at "L". In this case, total charge pump current becomes the sum of charge pump current $i_1$ from self-oscillator and charge pump current $i_3$ based on signal from CAS line.

Thus, according to the present invention, it is possible to obtain a large quantity of charge pump current in any operation mode by way of generating charge pump current based on internal signal which is synchronized with both Ext, $\overline{RAS}$ and Ext, $\overline{CAS}$.

In the embodiment, only one charge pump circuit is shown to be activated by signals from RAS line and CAS line respectively. However, it is possible to provide a plurality of charge pump circuits on any places on the semiconductor device on which these signal lines and power line are available so as to be able to obtain more large charge current.

Furthermore, in the embodiment, the expression Vcc–$V_T$(V) indicates an amplitude of waveform of A and B made by signals from RAS line and CAS line. However, the amplitude can become Vcc(V) by way of raising the potentials of signals, which are introduced into MOS transistor 106 and 111 shown in FIG. 4, more than a value obtained by the expression Vcc+$V_T$(V) so as to be able to gain larger charge pump current.

As illustrated above, in addition to a substrate bias generating circuit with regard to the self-oscillator, other substrate bias generating circuits driven by internal clock pulses synchronized with signals of Ext, $\overline{RAS}$ and Ext, $\overline{CAS}$ are provided so that power consumption is reduced during holding time of RAM and large charge pump current applicable to various operation modes of random access memory is able to obtain during operation time thereof.

We claim:

1. A substrate bias generating device included in a dynamic type random access memory, comprising:

a self-oscillator generating a periodic output;

a first capacitor having a first electrode connected with an output terminal of said self-oscillator;

a first rectifier circuit having a first terminal connected with a second electrode of said first capacitor and a second terminal which is connected with [said] *an* output terminal *of said substrate bias generating device*;

a charge pump circuit of $\overline{RAS}$ line including a second capacitor having a first electrode which receives a signal synchronized with an external $\overline{RAS}$ signal supplied from outside to said random access memory, and a second rectifier circuit having a first terminal connected with a second electrode of said second capacitor and a second terminal which is connected with [said] *the* output terminal *of said substrate bias generating device*; and a charge pump circuit of $\overline{CAS}$ line including a third capacitor having a first electrode which receives a signal synchronized with an external $\overline{CAS}$ signal supplied from outside to said random access memory, and a third rectifier circuit having a first terminal connected with a second electrode of said third capacitor and a [third] *second* terminal which is connected with [said] *the* output terminal *of said substrate bias generating device*.

2. A substrate bias generating device as set forth in claim 1, wherein, each of said first rectifier circuit, said second rectifier circuit and said third rectifier circuit comprises a pair of MOS transistors in series in which [both] *the* drain electrode of one of said MOS transistors [are] *is* connected with [said] *the* output terminal *of said substrate bias generating device* and said other] *second* [electrodes] *electrode* of each of said first capacitor, said second capacitor and said third capacitor being connected at a node with which said pair of MOS transistors are connected.

3. A substrate bias generating device as set forth in claim 1, wherein; said signal synchronized with said external $\overline{RAS}$ signal being delayed from said external $\overline{RAS}$ signal and said signal synchronized with said external $\overline{CAS}$ signal being delayed from said external $\overline{CAS}$ signal.

4. A substrate bias generating device as set forth in claim 1, wherein; a plurality of said charge pump circuits of $\overline{RAS}$ line and said charge pump circuits of $\overline{CAS}$ line are provided therein.

* * * * *